(12) United States Patent
Huang et al.

(10) Patent No.: US 9,438,192 B2
(45) Date of Patent: Sep. 6, 2016

(54) CAPACITIVE PROGRAMMABLE GAIN AMPLIFIER

(71) Applicant: QUALCOMM Incorporated, San Diego, CA (US)

(72) Inventors: Wenchang Huang, San Diego, CA (US); Peter Jivan Shah, San Diego, CA (US); Meysam Azin, San Diego, CA (US); Arash Mehrabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 32 days.

(21) Appl. No.: 14/242,285

(22) Filed: Apr. 1, 2014

(65) Prior Publication Data
US 2015/0280668 A1    Oct. 1, 2015

(51) Int. Cl.
| | | |
|---|---|---|
| *H03F 1/02* | (2006.01) | |
| *H03G 3/00* | (2006.01) | |
| *H03G 1/00* | (2006.01) | |
| *H03F 3/45* | (2006.01) | |

(52) U.S. Cl.
CPC .......... *H03G 3/008* (2013.01); *H03F 3/45475* (2013.01); *H03G 1/0088* (2013.01); *H03G 3/001* (2013.01); *H03F 2200/129* (2013.01); *H03F 2200/267* (2013.01); *H03F 2203/45118* (2013.01); *H03F 2203/45156* (2013.01); *H03F 2203/45514* (2013.01)

(58) Field of Classification Search
CPC ............... H03F 1/02; H03F 2200/156; H03F 2200/294; H03F 2200/252
USPC .............................. 330/9, 107, 109
See application file for complete search history.

(56) References Cited

U.S. PATENT DOCUMENTS

| | | | |
|---|---|---|---|
| 4,441,082 A | 4/1984 | Haque | |
| 5,363,055 A | 11/1994 | Ribner | |
| 6,288,669 B1 | 9/2001 | Gata | |
| 6,727,749 B1* | 4/2004 | Quinn ...................... | G06G 7/14 327/124 |
| 7,265,705 B1 | 9/2007 | Lee et al. | |
| 8,610,467 B2 | 12/2013 | Kabir et al. | |
| 8,638,165 B2 | 1/2014 | Shah et al. | |
| 2004/0217815 A1 | 11/2004 | Shirai | |
| 2008/0012634 A1 | 1/2008 | Oyang et al. | |
| 2009/0273386 A1 | 11/2009 | Korobeynikov et al. | |
| 2012/0182067 A1* | 7/2012 | Prasad et al. ..................... | 330/7 |
| 2015/0002209 A1 | 1/2015 | Sivakumar | |
| 2015/0304137 A1 | 10/2015 | Azin | |

OTHER PUBLICATIONS

International Search Report and Written Opinion of the International Searching Authority for International Application No. PCT/US2015/021572, mailed Jun. 2, 2015, 10 pages.

* cited by examiner

*Primary Examiner* — Steven J Mottola
(74) *Attorney, Agent, or Firm* — Toler Law Group, PC

(57) ABSTRACT

An apparatus includes an operational amplifier and a plurality of capacitors coupled to an input terminal of the operational amplifier and configured to be selectively coupled to receive one of an input voltage signal and an output voltage signal of the operational amplifier.

21 Claims, 6 Drawing Sheets

CAPACITIVE PROGRAMMABLE GAIN AMPLIFIER

I. FIELD

The present disclosure is generally related to a capacitive programmable gain amplifier.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones may include microphones configured to capture audio signals. A capacitive programmable gain amplifier (PGA) may be used to amplify a signal, such as a microphone signal (e.g., an audio signal). The capacitive PGA may include multiple input capacitors coupled to a common mode input of an operational amplifier (e.g., virtual ground) and multiple feedback capacitors coupled to an output of the operational amplifier and to virtual ground. Each input capacitor may be selectively coupled to or decoupled from the common mode input using corresponding switching circuitry to control the gain of the capacitive PGA. In a similar manner, each feedback capacitor may be selectively coupled to or decoupled from the common mode input using corresponding switching circuitry to control the gain of the capacitive PGA. However, leakage current from the switching circuitry may flow to the common mode input (e.g., a high impedance node) which may reduce linearity and reduce an input voltage range. For example, the leakage current may reduce headroom of the capacitive PGA that is used for voltage swings at the output of the operational amplifier. The reduced headroom may cause reduced linearity and input voltage range. In addition, decoupling input capacitors and feedback capacitors may reduce noise performance. For example, inactive capacitors may increase an amount of noise of the capacitive PGA.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
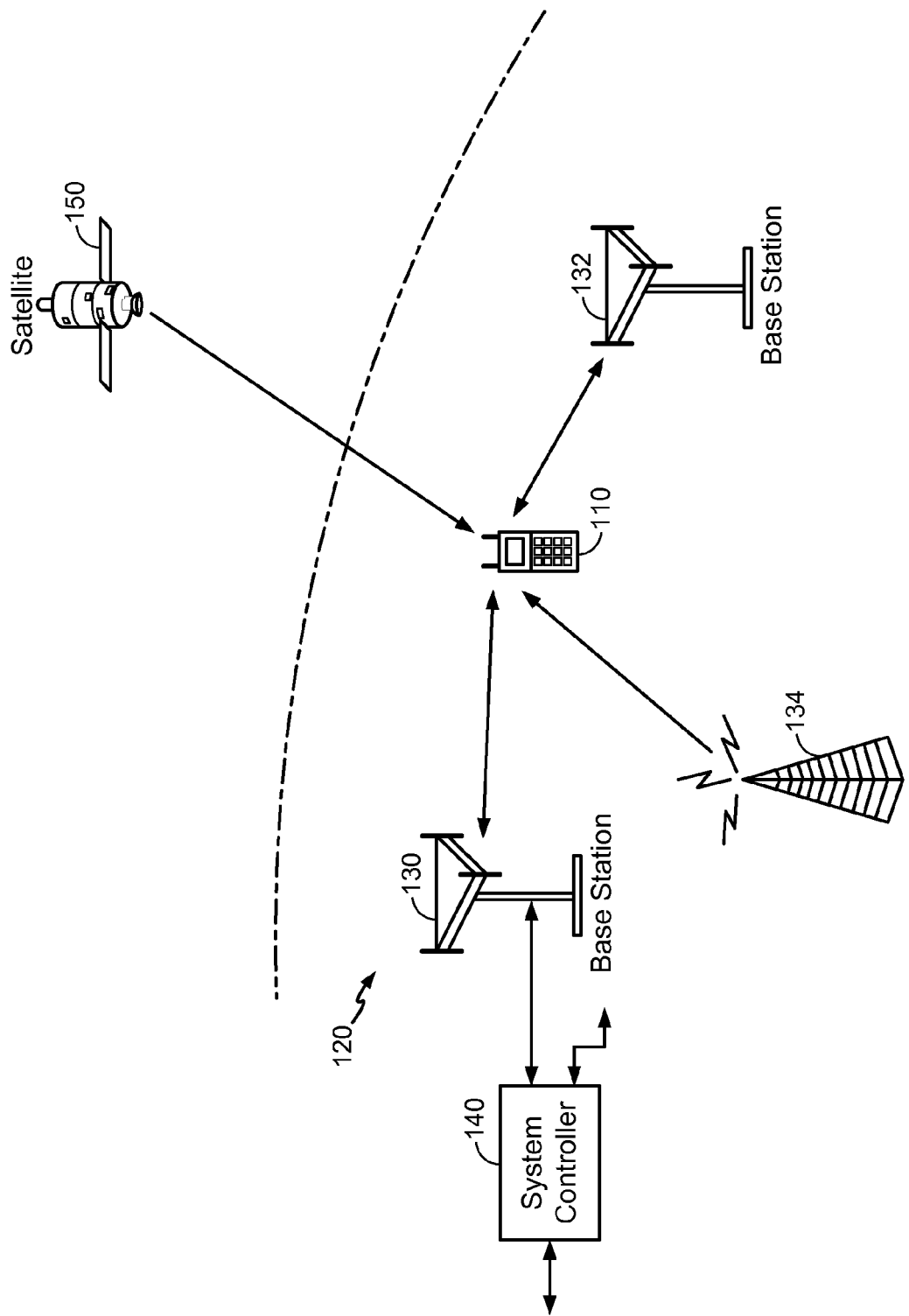
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1xEVDO, TD-SCDMA, GSM, 802.11, etc.

Figure 2:
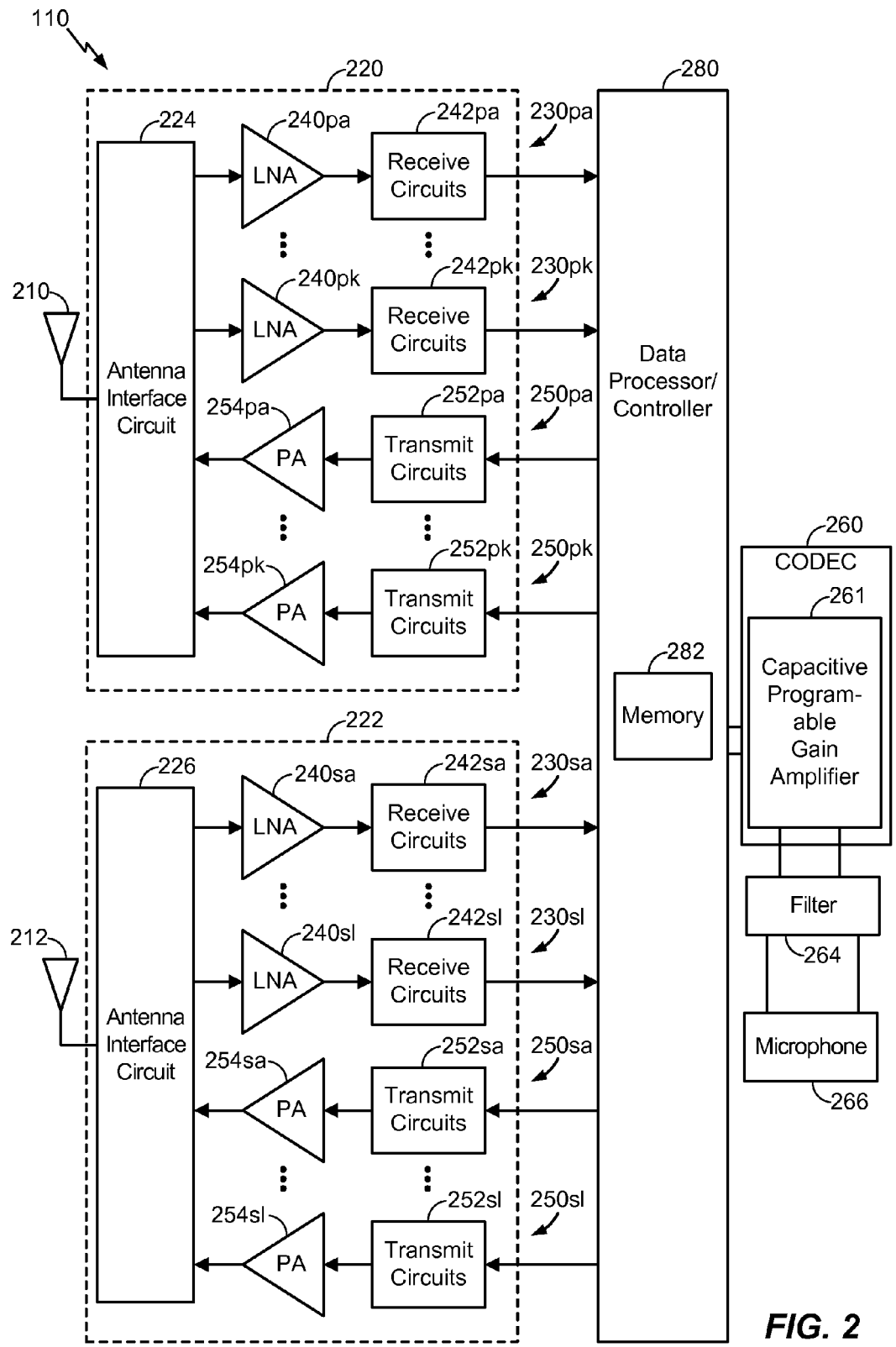
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230*pa* to 230*pk* and multiple (K) transmitters 250*pa* to 250*pk* to support multiple frequency bands, multiple radio technologies, carrier aggregation, etc. Transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

A coder/decoder (CODEC) 260 may be coupled to the data processor 280. The CODEC 260 may include a capacitive programmable gain amplifier 261. The capacitive programmable gain amplifier 261 is integrated into the CODEC 260 and is operable to adjust a magnitude of audio signals (e.g., amplify audio signals) at the wireless device 110. For example, the capacitive programmable gain amplifier 261 may amplify audio speech signals received by the wireless device 110 via a microphone 266. In an exemplary embodiment, the audio signals captured by the microphone 266 may be filtered by a filter 264, and the filtered audio signals are amplified by the capacitive programmable gain amplifier 261.

Wireless device 110 may support multiple band groups, multiple radio technologies, and/or multiple antennas. Wireless device 110 may include a number of LNAs to support reception via the multiple band groups, multiple radio technologies, and/or multiple antennas.

Figure 3:
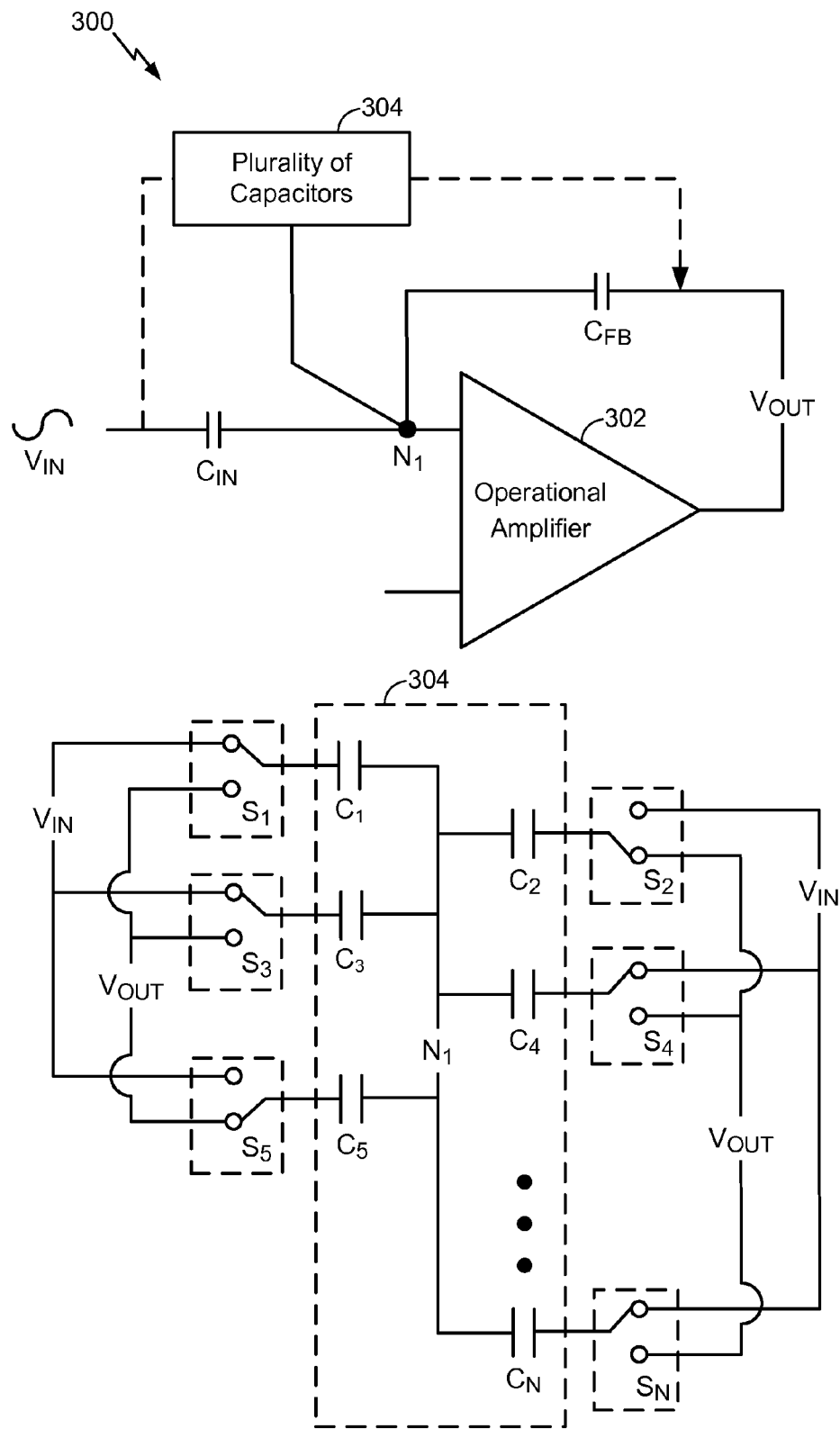
FIG. 3 is a diagram that depicts an exemplary embodiment of a system that is operable to reduce leakage current and improve power supply rejection ratio (PSRR) of a single-ended programmable capacitive gain amplifier.

Referring to FIG. 3, a diagram of a system 300 that is operable to reduce leakage current and improve power supply rejection ratio (PSRR) of a single-ended programmable capacitive gain amplifier is shown. In an exemplary embodiment, the system 300 may correspond to a capacitive programmable gain amplifier. For example, the system 300 may correspond to the capacitive programmable gain amplifier 261 of FIG. 2. The system 300 is operable to amplify audio signals captured by a microphone, such as the microphone 266 of FIG. 2. The system 300 includes an operational amplifier 302 and a plurality of capacitors 304.

An input capacitor ($C_{IN}$) may be coupled in series to a common mode input (e.g., a first node ($N_1$)) of the operational amplifier 302. In an exemplary embodiment, the first node ($N_1$) corresponds to a virtual ground of the system 300. For example, the first node ($N_1$) is coupled to a first input of the operational amplifier 302. The input capacitor ($C_{IN}$) may be included in an input path that provides input signals to the operational amplifier 302. For example, an input voltage signal ($V_{IN}$) (e.g., an audio signal, such as a microphone signal) may be provided to a first terminal of the input capacitor ($C_{IN}$), and a second terminal of the input capacitor ($C_{IN}$) may be coupled to the first node ($N_1$). The input capacitor ($C_{IN}$) may charge and discharge based on a voltage level of the input voltage signal ($V_{IN}$). For example, the input capacitor ($C_{IN}$) may charge when the input voltage signal ($V_{IN}$) has a logical high voltage level, and the input capacitor ($C_{IN}$) may discharge when the input voltage signal ($V_{IN}$) has a logical low voltage level.

An output of the operational amplifier 302 includes a feedback path that includes a feedback capacitor ($C_{FB}$). For example, a first terminal of the feedback capacitor ($C_{FB}$) may be coupled to the output of the operational amplifier 302, and a second terminal of the feedback capacitor ($C_{FB}$) may be coupled to the first node ($N_1$). The operational amplifier 302 may be configured to amplify the input voltage signal ($V_{IN}$) to generate an output voltage signal ($V_{OUT}$). The output voltage signal ($V_{OUT}$) may be provided to the first terminal of the feedback capacitor ($C_{FB}$), and the feedback capacitor ($C_{FB}$) may charge and discharge based on a voltage level of the output voltage signal ($V_{OUT}$). For example, the feedback capacitor ($C_{FB}$) may charge when the output voltage signal ($V_{OUT}$) has a logical high voltage level, and the feedback capacitor ($C_{FB}$) may discharge when the output voltage signal ($V_{OUT}$) has a logical low voltage level. In an exemplary embodiment, a second feedback path (not shown) coupled to the first node ($N_1$) and to the output of the operational amplifier 302 may include a switching capacitor circuit (not shown) that may be configured to generate a relatively large resistance for direct-current feedback by coupling and decoupling a capacitor (not shown) to the first node ($N_1$) at an accelerated rate.

The gain of the capacitive programmable gain amplifier (e.g., the gain of the system 300) is based on an input capacitance and a feedback capacitance. For example, the gain of the capacitive programmable gain amplifier may be based on the capacitance of the input capacitor ($C_{IN}$) and the gain of the feedback capacitor ($C_{FB}$). In an exemplary embodiment, the gain is equal to (or approximately equal to) the input capacitance divided by the feedback capacitance.

The gain of the capacitive programmable gain amplifier may be adjusted by selectively coupling capacitors in parallel to the input capacitor ($C_{IN}$) and/or selectively coupling capacitors in parallel to the feedback capacitor ($C_{FB}$). For example, the gain of the capacitive programmable gain amplifier may be increased by coupling capacitors in parallel to the input capacitor ($C_{IN}$) (e.g., increasing the input capacitance), and the gain of the capacitive programmable gain amplifier may be decreased by coupling capacitors in parallel to the feedback capacitor ($C_{IN}$) (e.g., increasing the feedback capacitance).

The plurality of capacitors 304 includes multiple capacitors ($C_1$-$C_N$). For example, the plurality of capacitors 304 may include a first capacitor ($C_1$), a second capacitor ($C_2$), a third capacitor ($C_3$), a fourth capacitor ($C_4$), a fifth capacitor ($C_5$), and an $N^{th}$ capacitor ($C_N$), where N is any integer greater than one. For example, if N is equal to nine, the plurality of capacitors 304 includes nine capacitors.

In an exemplary embodiment, each capacitor ($C_1$-$C_N$) in the plurality of capacitors 304 may have uniform incremental capacitances. For example, the capacitance of the second capacitor ($C_2$) may be twice the capacitance of the first capacitor ($C_1$), the capacitance of the third capacitor ($C_3$) may be twice the capacitance of the second capacitor ($C_2$), etc. As a non-limiting example, the first capacitor ($C_1$) may have a capacitance of 625 femto-Farads (fF), and the second capacitor ($C_2$) may have a capacitance of 1.25 pico-Farads (pF) (e.g., 625 fF×2). The third capacitor ($C_3$) may have a capacitance of 2.5 pF (e.g., 1.25 pF×2), the fourth capacitor ($C_4$) may have a capacitance of 5.0 pF (e.g., 2.5 pF×2), the fifth capacitor ($C_5$) may have a capacitance of 10.0 pF (e.g., 5.0 pF×2), etc.

In another exemplary embodiment, each capacitor ($C_1$-$C_N$) in the plurality of capacitors 304 may have non-uniform incremental capacitances. As a non-limiting example, the first capacitor ($C_1$) may have a capacitance of 0.168 pF, the second capacitor ($C_2$) may have a capacitance of 0.197 pF, the third capacitor ($C_3$) may have a capacitance of 0.231 pF, etc. To reduce a gain error associated with the non-uniform incremental capacitances; each capacitor ($C_1$-$C_N$) may have a common finger length in a metal-oxide-metal (MOM) capacitor layout and different widths in the MOM capacitor layout. For example, each capacitor ($C_1$-$C_N$) may be constructed using multiple lines (e.g., fingers) and capacitors in series may share fingers to reduce parasitic capacitance.

Each capacitor ($C_1$-$C_N$) may be selectively coupled in parallel to the input capacitor ($C_{IN}$) (e.g., coupled to the first node ($N_1$) and to the input voltage signal ($V_{IN}$) or selectively coupled in parallel to the feedback capacitor ($C_{FB}$) (e.g., coupled to the first node ($N_1$) and to the output voltage signal ($V_{OUT}$).

For example, a plurality of switches ($S_1$-$S_N$) may be coupled to the plurality of capacitors 304. Each switch ($S_1$-$S_N$) may be configured to couple a corresponding capacitor ($C_1$-$C_N$) to receive the input voltage signal ($V_{IN}$) or to receive the output voltage signal ($V_{OUT}$). For example, the first switch ($S_1$) is coupled to a first terminal of the first capacitor ($C_1$) and may be selectively coupled to a terminal associated with the input voltage signal ($V_{IN}$) or to a terminal associated with the output voltage signal ($V_{OUT}$). The second switch ($S_2$) is coupled to a first terminal of the second capacitor ($C_2$) and may be selectively coupled to a terminal associated with the input voltage signal ($V_{IN}$) or to a terminal associated with the output voltage signal ($V_{OUT}$). The third switch ($S_3$) is coupled to a first terminal of the third capacitor ($C_3$) and may be selectively coupled to a terminal associated with the input voltage signal ($V_{IN}$) or to a terminal associated with the output voltage signal ($V_{OUT}$). The fourth switch ($S_4$) is coupled to a first terminal of the fourth capacitor ($C_4$) and may be selectively coupled to a terminal associated with the input voltage signal ($V_{IN}$) or to a terminal associated with the output voltage signal ($V_{OUT}$). The fifth switch ($S_5$) is coupled to a first terminal of the fifth capacitor ($C_5$) and may be selectively coupled to a terminal associated with the input voltage signal ($V_{IN}$) or to a terminal associated with the output voltage signal ($V_{OUT}$). The $N^{th}$ switch ($S_N$) is coupled to a first terminal of the $N^{th}$ capacitor ($C_N$) and may be selectively coupled to a terminal associated with the input voltage signal ($V_{IN}$) or to a terminal associated with the output voltage signal ($V_{OUT}$).

Each capacitor ($C_1$-$C_N$) is coupled to virtual ground (e.g., the input of the operational amplifier 302). For example, a second terminal of the first capacitor ($C_1$) is coupled to the first node ($N_1$), a second terminal of the second capacitor ($C_2$) is coupled to the first node ($N_1$), and a second terminal of the third capacitor ($C_3$) is coupled to the first node ($N_1$). In a similar manner, a second terminal of the fourth capacitor ($C_4$) is coupled to the first node ($N_1$), a second terminal of the fifth capacitor ($C_5$) is coupled to the first node ($N_1$), and a second terminal of the $N^{th}$ capacitor ($C_N$) is coupled to the first node ($N_1$).

The gain of the capacitive programmable gain amplifier may be adjusted via the switches ($S_1$-$S_N$). For example, the gain may be increased by decoupling a switch from the terminal associated with the output voltage signal ($V_{OUT}$) and coupling the switch to the terminal associated with the input voltage signal ($V_{IN}$). As illustrated in FIG. 3, the second switch ($S_2$) is coupled to the terminal associated with the output voltage signal ($V_{OUT}$). Thus, the second capacitor ($C_2$) is coupled in parallel with the feedback capacitor ($C_{FB}$). To increase the gain of the capacitive programmable gain amplifier, the second switch ($S_2$) may decouple from the terminal associated with the output voltage signal ($V_{OUT}$) and couple to the terminal associated with the input voltage signal ($V_{IN}$) (e.g., coupling the second capacitor ($C_2$) in parallel with input capacitor ($C_{IN}$)). As a result, the input capacitance may increase by the capacitance of the second capacitor ($C_2$), and the feedback capacitance may decrease by the capacitance of the second capacitor ($C_2$). Increasing the input capacitance and decreasing the feedback capacitance produces a higher gain. The fifth switch ($S_5$) may operate in a substantially similar manner to increase the gain of the capacitive programmable gain amplifier.

The gain may be decreased by decoupling a switch from the terminal associated with the input voltage signal ($V_{IN}$) and coupling the switch to the terminal associated with the output voltage signal ($V_{OUT}$). As illustrated in FIG. 3, the first switch ($S_1$) is coupled to the terminal associated with the input voltage signal ($V_{IN}$). Thus, the first capacitor ($C_1$) is coupled in parallel with the input capacitor ($C_{IN}$). To decrease the gain of the capacitive programmable gain amplifier, the first switch ($S_1$) may decouple from the terminal associated with the input voltage signal ($V_{IN}$) and couple to the terminal associated with the output voltage signal ($V_{OUT}$) (e.g., coupling the first capacitor ($C_1$) in parallel with feedback capacitor ($C_{FB}$)). As a result, the input capacitance may decrease by the capacitance of the first capacitor ($C_1$), and the feedback capacitance may increase by the capacitance of the first capacitor ($C_1$). Increasing the feedback capacitance and decreasing the input capacitance produces a lower gain. The third, fourth, and $N^{th}$ switches ($S_3$, $S_4$, $S_N$) may operate in a substantially similar manner to decrease the gain of the capacitive programmable gain amplifier.

The system 300 of FIG. 3 may reduce common mode shifts at virtual ground (e.g., the input of the operational amplifier 302) to increase an input voltage range and to increase linearity based on improved (e.g., increased) headroom. For example, the input of the system 300 (e.g., the node coupled to receive the input voltage signal ($V_{IN}$)) and the output of the system 300 (e.g., the node coupled to receive the output voltage signal ($V_{OUT}$)) are low impedance nodes, and the first node ($N_1$) is a high impedance node. The switches ($S_1$-$S_N$) may be coupled to terminals associated with the output voltage signal ($V_{OUT}$) (e.g., the output of the system 300) and/or terminals coupled to terminals associated with the input voltage signal ($V_{IN}$) (e.g., the input of the system 300) rather than coupled to the first node ($N_1$) (e.g., virtual ground). As a result, leakage currents generated from the switches ($S_1$-$S_N$) may propagate to low impedance nodes as opposed to a high impedance node (e.g., the first node ($N_1$)). Preventing leakage currents from propagating to high impedance nodes may increase the input voltage range and increase the linearity of the capacitive programmable gain amplifier. Additionally, because the leakage currents associated with the switches ($S_1$-$S_N$) propagate to low impedance nodes (as opposed to virtual ground), PSRR is increased.

It will also be appreciated that each capacitor ($C_1$-$C_N$) in the plurality of capacitors 304 is utilized as either an input capacitor (e.g., coupled to in parallel to the input capacitor ($C_{IN}$) or a feedback capacitor (e.g., coupled in parallel to the feedback capacitor ($C_{FB}$)). Because each capacitor ($C_1$-$C_N$) in the plurality of capacitors 304 is utilized as either an input capacitor or a feedback capacitor, the capacitive programmable gain amplifier may achieve improved noise performance (e.g., reduced noise) at high gain modes (e.g., relatively large input capacitance) with improved monotonicity.

Figure 4:
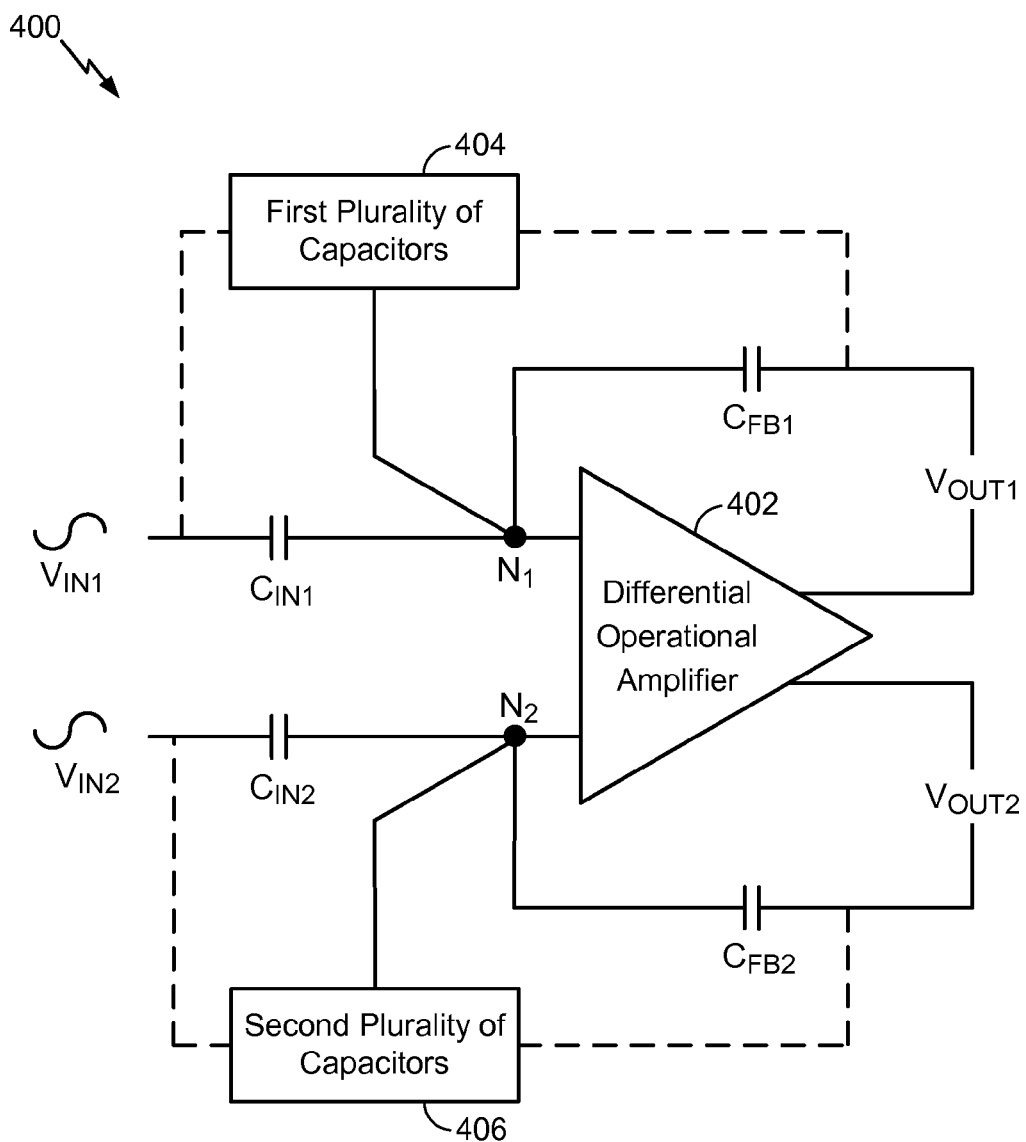
FIG. 4 is a diagram that depicts an exemplary embodiment of a system that is operable to reduce leakage current and improve PSRR of a double-ended programmable capacitive gain amplifier.

Referring to FIG. 4, a diagram of a system 400 that is operable to reduce leakage current and improve power supply rejection ratio (PSRR) of a double-ended programmable capacitive gain amplifier is shown. In an exemplary embodiment, the system 400 may correspond to a capacitive programmable gain amplifier. For example, the system 400 may correspond to the capacitive programmable gain amplifier 261 of FIG. 2. The system 400 is operable to amplify audio signals captured by a microphone, such as the microphone 266 of FIG. 2. The system 400 includes a differential operational amplifier 402, a first plurality of capacitors 404, and a second plurality of capacitors 406.

A first input capacitor ($C_{IN1}$) may be coupled in series to a common mode input (e.g., a first node ($N_1$)) of the differential operational amplifier 402, and a second input capacitor ($C_{IN2}$) may be coupled in series to a second common mode input (e.g., a second node ($N_2$)) of the differential operational amplifier 402. In an exemplary embodiment, the first node ($N_1$) and the second node ($N_2$) correspond to a virtual ground of the system 400. For example, the first node ($N_1$) is coupled to a first input of the differential operational amplifier 402, and the second node ($N_2$) is coupled to a second input of the differential operational amplifier 402.

The first input capacitor ($C_{IN1}$) may be included in a first input path that provide a first differential input signal to the differential operational amplifier 402, and the second input capacitor ($C_{IN2}$) may be included in a second input path that provides a second differential input signal to the differential operational amplifier 402. For example, a first input voltage signal ($V_{IN1}$) may be provided to a first terminal of the first input capacitor ($C_{IN1}$), and a second input voltage signal ($V_{IN2}$) may be provided to a first terminal of the second input capacitors ($C_{IN2}$). In an exemplary embodiment, the first input voltage signal ($V_{IN1}$) and the second input voltage signal ($V_{IN2}$) are differential signals. A second terminal of the first input capacitor ($C_{IN1}$) is coupled to the first node ($N_1$), and a second terminal of the second input capacitor ($C_{IN2}$) is coupled to the second node ($N_2$).

A first output of the differential operational amplifier 402 includes a first feedback path that includes a first feedback capacitor ($C_{FB1}$), and a second output of the differential operational amplifier 402 includes a second feedback path that includes a second feedback capacitor ($C_{FB2}$). For example, a first terminal of the first feedback capacitor ($C_{FB1}$) may be coupled to the first output of the differential operational amplifier 402, and a second terminal of the first feedback capacitor ($C_{FB1}$) may be coupled to the first node ($N_1$). In a similar manner, a first terminal of the second feedback capacitor ($C_{FB2}$) may be coupled to the second output of the differential operational amplifier 402, and a second terminal of the second feedback capacitor ($C_{FB2}$) may be coupled to the second node ($N_2$).

The differential operational amplifier 402 may be configured to amplify the input voltage signals ($V_{IN1}$, $V_{IN2}$) to generate a first output voltage signal ($V_{OUT1}$) and a second output voltage signal ($V_{OUT2}$). In an exemplary embodiment, the first output voltage signal ($V_{OUT1}$) and the second output voltage signal ($V_{OUT2}$) are differential signals. The first output voltage signal ($V_{OUT1}$) may be provided to the first terminal of the first feedback capacitor ($C_{FB1}$), and the first feedback capacitor ($C_{FB1}$) may charge and discharge based on a voltage level of the first output voltage signal ($V_{OUT1}$). In a similar manner, the second output voltage signal ($V_{OUT2}$) may be provided to the first terminal of the second feedback capacitor ($C_{FB2}$), and the second feedback capacitor ($C_{FB2}$) may charge and discharge based on a voltage level of the second output voltage signal ($V_{OUT2}$).

The gain of the capacitive programmable gain amplifier may be adjusted by selectively coupling capacitors in parallel to the input capacitors ($C_{IN1}$, $C_{IN2}$) and/or selectively coupling capacitors in parallel to the feedback capacitors ($C_{FB1}$, $C_{FB2}$). For example, the gain of the capacitive programmable gain amplifier may be increased by coupling capacitors in parallel to the input capacitors ($C_{IN1}$, $C_{IN2}$) (e.g., increasing the input capacitance), and the gain of the capacitive programmable gain amplifier may be decreased by coupling capacitors in parallel to the feedback capacitors ($C_{FB1}$, $C_{FB2}$) (e.g., increasing the feedback capacitance).

Figure 5:
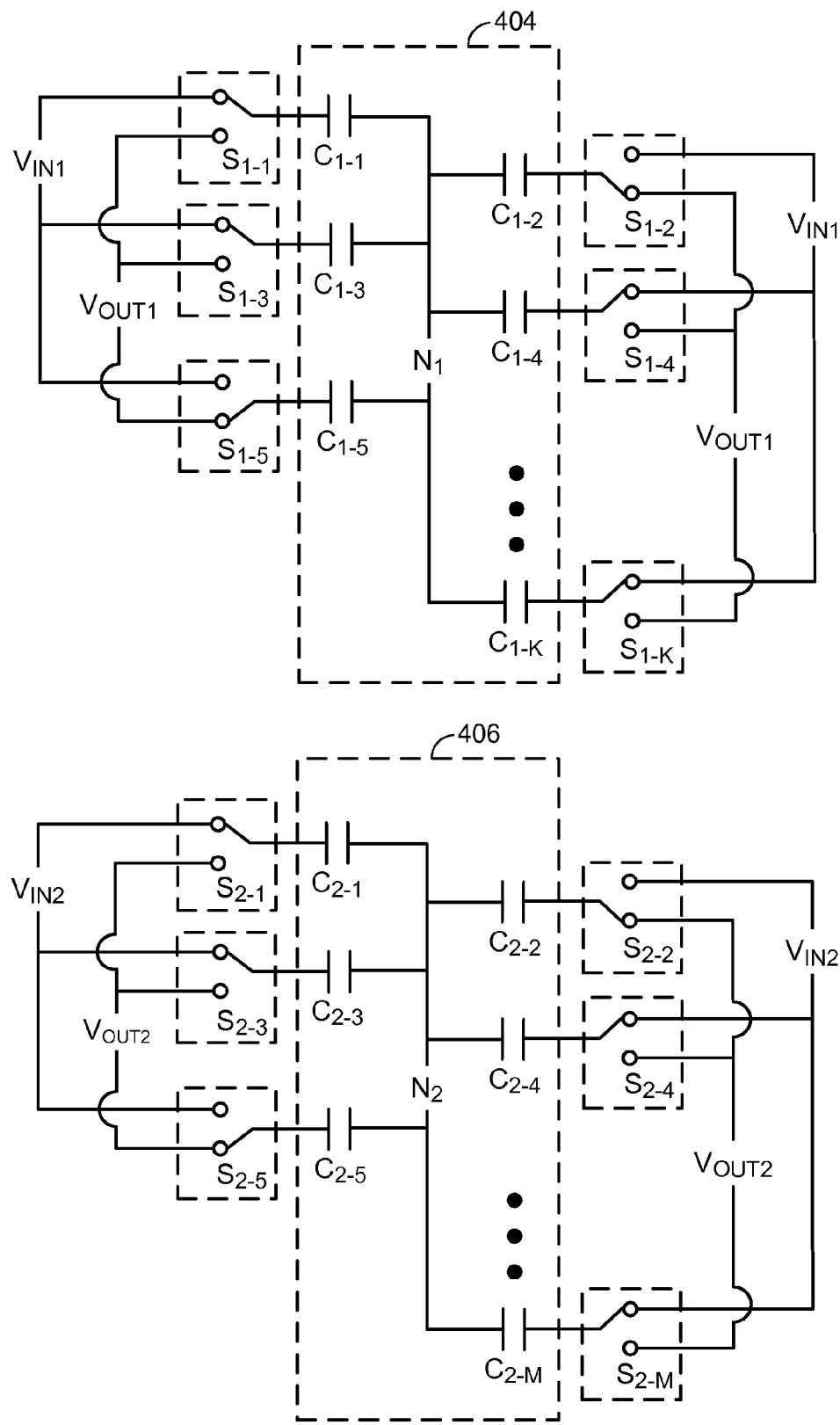
FIG. 5 is a circuit diagram of a first plurality of capacitors and a second plurality of capacitors in the system of FIG. 4.

As illustrated in FIG. 5, the first plurality of capacitors 404 includes multiple capacitors ($C_1$-$C_K$). For example, the first plurality of capacitors 404 may include a first capacitor ($C_{1-1}$), a second capacitor ($C_{1-2}$), a third capacitor ($C_{1-3}$), a fourth capacitor ($C_{1-4}$), a fifth capacitor ($C_{1-5}$), and a $K^{th}$ capacitor ($C_K$), where K is any integer greater than zero. For example, if K is equal to twelve, the first plurality of capacitors 404 includes twelve capacitors. The second plurality of capacitors 406 includes multiple capacitors ($C_1$-$C_M$). For example, the second plurality of capacitors 404 may include a first capacitor ($C_{2-1}$), a second capacitor ($C_{2-2}$), a third capacitor ($C_{2-3}$), a fourth capacitor ($C_{2-4}$), a fifth capacitor ($C_{2-5}$), and an $M^{th}$ capacitor ($C_M$), where M is any integer greater than one. In an exemplary embodiment, the first plurality of capacitors 404 and the second plurality of capacitors 406 include an equal number of capacitors (e.g., K=M).

The first and second plurality of capacitors 404-406 may operate in a substantially similar manner as the plurality of capacitors 304 in FIG. 3. For example, the first terminal of each capacitor ($C_{1-1}$-$C_{1-K}$) in the first plurality of capacitors 404 may be coupled to a corresponding switch ($S_{1-1}$-$S_{1-K}$), and each switch ($S_{1-1}$-$S_{1-k}$) may be configured to couple the corresponding capacitor ($C_{1-1}$-$C_{1-K}$) to the first input voltage signal ($V_{IN1}$) or to the first output voltage signal ($V_{OUT1}$). Thus, each capacitor ($C_{1-1}$-$C_{1-K}$) may be selectively coupled in parallel to the first input capacitor ($C_{IN1}$) (e.g., coupled to the first node ($N_1$) and to receive the first input voltage signal ($V_{IN1}$) or selectively coupled in parallel to the first feedback capacitor ($C_{FB1}$) (e.g., coupled to the first node ($N_1$) and to receive the first output voltage signal ($V_{OUT1}$)).

In a similar manner, the first terminal of each capacitor ($C_{2-1}$-$C_{2-M}$) in the second plurality of capacitors 406 may be coupled to a corresponding switch ($S_{2-1}$-$S_{2-M}$), and each switch ($S_{2-1}$-$S_{2-K}$) may be configured to couple the corresponding capacitor ($C_{2-1}$-$C_{2-M}$) to receive the second input voltage signal ($V_{IN2}$) or to receive the second output voltage signal ($V_{OUT2}$). Thus, each capacitor ($C_{2-1}$-$C_{2-M}$) may be selectively coupled in parallel to the second input capacitor ($C_{IN2}$) (e.g., coupled to the second node ($N_2$) and to receive the second input voltage signal ($V_{IN2}$)) or selectively coupled in parallel to the second feedback capacitor ($C_{FB2}$) (e.g., coupled to the second node ($N_2$) and to receive the second output voltage signal ($V_{OUT2}$)).

The gain of the capacitive programmable gain amplifier in FIG. 4 may be adjusted via the switches ($S_{1-1}$-$S_{1-K}$, $S_{2-1}$-$S_{2-K}$). For example, the gain may be increased by decoupling switches from the terminals associated with the first and second output voltage signals ($V_{OUT1}$, $V_{OUT2}$) and coupling the switches to the terminals associated with the first and second input voltage signal ($V_{IN1}$, $V_{IN2}$). As illustrated in FIG. 5, the second switch ($S_{1-2}$) is coupled to the terminal associated with the first output voltage signal ($V_{OUT1}$), and the second switch ($S_{2-2}$) is coupled to the terminal associated with the second output voltage signal ($V_{OUT2}$). Thus, the second capacitor ($C_{1-2}$) in the first plurality of capacitors 404 is coupled in parallel with the first feedback capacitor ($C_{FB1}$), and the second capacitor ($C_{2-2}$) in the second plurality of capacitors 406 is coupled in parallel with the second feedback capacitor ($C_{FB2}$). To increase the gain of the capacitive programmable gain amplifier, the second switch ($S_{1-2}$) may decouple from the terminal associated with the first output voltage signal ($V_{OUT1}$) and couple to the terminal associated with the first input voltage signal ($V_{IN1}$) (e.g., coupling the second capacitor ($C_{1-2}$) in parallel with first input capacitor ($C_{IN1}$)). In a similar manner, the second switch ($S_{2-2}$) may decouple from the terminal associated with the second output voltage signal ($V_{OUT2}$) and couple to the terminal associated with the second input voltage signal ($V_{IN2}$) (e.g., coupling the second capacitor ($C_{2-2}$) in parallel with second input capacitor ($C_{IN2}$)).

The gain may be decreased by decoupling switches from the terminals associated with the first and second input voltage signals ($V_{IN1}$, $V_{IN2}$) and coupling the switches to the terminals associated with the first and second output voltage signals ($V_{OUT1}$, $V_{OUT2}$). As illustrated in FIG. 5, the first switch ($S_{1-1}$) is coupled to the terminal associated with the first input voltage signal ($V_{IN1}$), and the first switch ($S_{2-1}$) is coupled to the terminal associated with the second input voltage signal ($V_{IN2}$). Thus, the first capacitor ($C_{1-1}$) in the first plurality of capacitors 404 is coupled in parallel with the first input capacitor ($C_{IN1}$), and the first capacitor ($C_{2-1}$) in the second plurality of capacitors 406 is coupled in parallel with the second input capacitor ($C_{IN2}$). To decrease the gain of the capacitive programmable gain amplifier, the first switch ($S_{1-1}$) may decouple from the terminal associated with the first input voltage signal ($V_{IN1}$) and couple to the terminal associated with the first output voltage signal ($V_{OUT1}$) (e.g., coupling the first capacitor ($C_{1-1}$) in parallel with first feedback capacitor ($C_{FB1}$)). In a similar manner, the first switch ($S_{2-1}$) may decouple from the terminal associated with the second input voltage signal ($V_{IN2}$) and couple to the terminal associated with the second output voltage signal ($V_{OUT2}$) (e.g., coupling the first capacitor ($C_{2-1}$) in parallel with second feedback capacitor ($C_{FB2}$)).

The system 400 of FIG. 4 may reduce common mode shifts at virtual ground (e.g., the inputs of the differential operational amplifier 402) to increase an input voltage range and to increase linearity based on improved (e.g., increased) headroom. For example, the inputs of the system 400 (e.g., the nodes coupled to receive the input voltage signals ($V_{IN1}$, $V_{IN2}$)) and the outputs of the system 400 (e.g., the nodes coupled to receive the output voltage signals ($V_{OUT1}$, $V_{OUT2}$)) are low impedance nodes, and the first node ($N_1$) and the second node ($N_2$) are high impedance node. The switches ($S_{1-1}$-$S_{1-K}$, $S_{2-1}$-$S_{1-M}$) may be coupled to terminals associated with the output voltage signals ($V_{OUT1}$, $V_{OUT2}$) (e.g., the outputs of the system 400) and/or terminals coupled to terminals associated with the input voltage signals ($V_{IN1}$, $V_{IN2}$) (e.g., the inputs of the system 400) rather than coupled to the virtual ground nodes ($N_1$, $N_2$). As a result, leakage currents generated from the switches ($S_{1-1}$-$S_{1-K}$, $S_{2-1}$-$S_{1-M}$) may propagate to low impedance nodes as opposed to a high impedance node. Preventing leakage currents from propagating to high impedance nodes may increase the input voltage range and increase the linearity of the capacitive programmable gain amplifier. Additionally, because the leakage currents associated with the switches ($S_{1-1}$-$S_{1-K}$, $S_{2-1}$-$S_{1-M}$) propagate to low impedance nodes (as opposed to virtual ground), PSRR is increased.

It will also be appreciated that each capacitor ($C_{1-1}$-$C_{1-K}$, $C_{2-1}$-$C_{2-M}$) in the plurality of capacitors 404, 406 is utilized as either an input capacitor (e.g., coupled to in parallel to the input capacitors ($C_{IN1}$, $C_{IN2}$)) or a feedback capacitor (e.g., coupled in parallel to the feedback capacitors ($C_{FB1}$, $C_{FB2}$)). Because each capacitor ($C_{1-1}$-$C_{1-K}$, $C_{2-1}$-$C_{2-M}$) in the plurality of capacitors 404, 406 is utilized as either an input capacitor or a feedback capacitor, the capacitive programmable gain amplifier may achieve improved noise performance (e.g., reduced noise) at high gain modes (e.g., relatively large input capacitance) with improved monotonicity.

Figure 6:
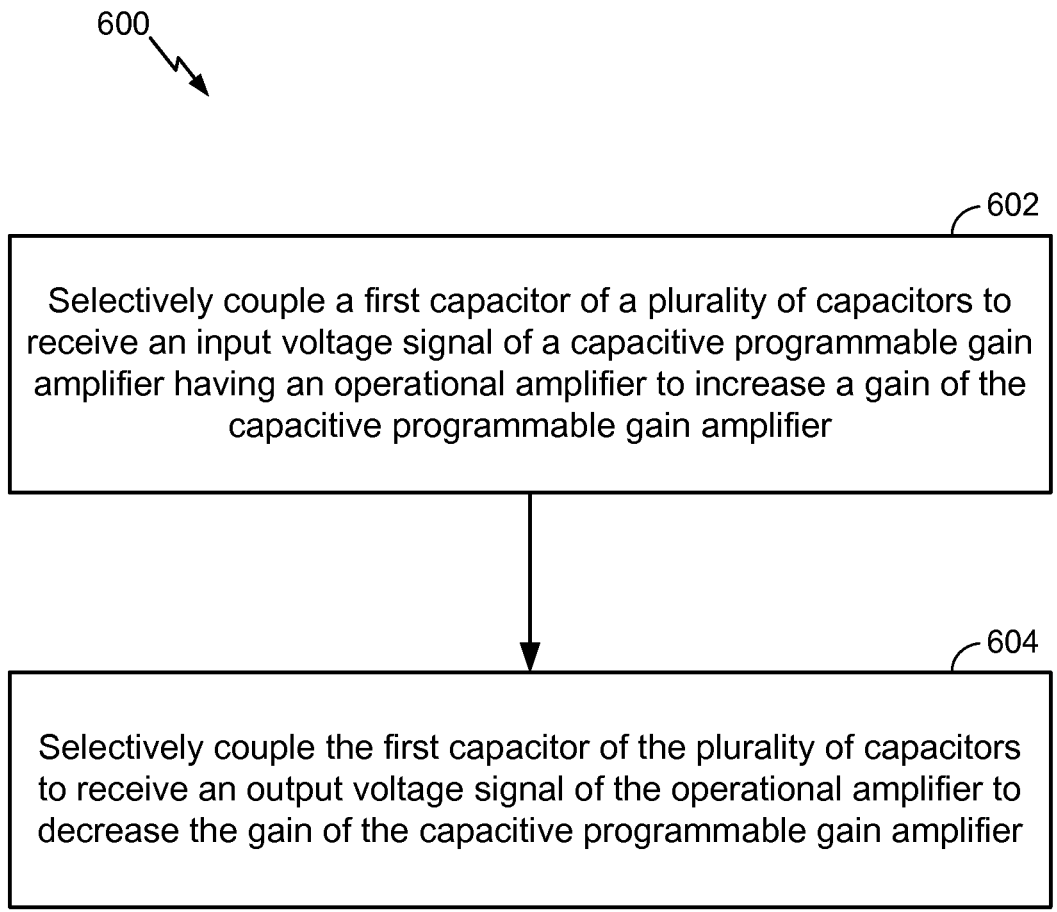
FIG. 6 is a flowchart that illustrates an exemplary embodiment of a method 600 of operating a capacitive programmable gain amplifier having reduced leakage current and improved PSRR.

Referring to FIG. 6, a flowchart that illustrates an exemplary embodiment of a method 600 of operating a capacitive programmable gain amplifier having reduced leakage current leakage and improved PSRR is shown. In an illustrative embodiment, the method 600 may be performed using the capacitive programmable gain amplifier 261 of the wireless device 110 of FIGS. 1-2, the system 300 of FIG. 3, the system 400 of FIG. 4, the switches of FIG. 5, or any combination thereof.

The method 600 includes selectively coupling a first capacitor of a plurality of capacitors to receive an input voltage signal of a capacitive programmable gain amplifier having an operational amplifier to increase a gain of the capacitive programmable gain amplifier, at 602. For example, referring to FIG. 3, the first switch ($S_1$) is coupled to the terminal associated with the input voltage signal ($V_{IN}$). When the first switch ($S_1$) is coupled to the terminal associated with the input voltage signal ($V_{IN}$), the first capacitor ($C_1$) is coupled to receive the input voltage signal ($V_{IN}$). For example, the first capacitor ($C_1$) is coupled in parallel with the input capacitor ($C_{IN}$) to increase the input capacitance of the capacitive programmable gain amplifier. Increasing the input capacitance of the capacitive programmable gain amplifier increases the gain of the capacitive programmable gain amplifier.

As another example, referring to FIG. 5, the first switch ($S_{1-1}$) is coupled to the terminal associated with the first input voltage signal ($V_{IN1}$), and the first switch ($S_{2-1}$) is coupled to the terminal associated with the second input voltage signal ($V_{IN2}$). When the first switches ($S_{1-1}$, $S_{2-1}$) are coupled to the terminals associated with the input voltage signals ($V_{IN1}$, $V_{IN2}$), the first capacitors ($C_{1-1}$, $C_{2-1}$) are coupled to receive the input voltage signals ($V_{IN1}$, $V_{IN2}$), respectively. For example, the first capacitor ($C_{1-1}$) in the first plurality of capacitors 404 is coupled in parallel with the first input capacitor ($C_{IN1}$), and the first capacitor ($C_{2-1}$) in the second plurality of capacitors 406 is coupled in parallel with the second input capacitor ($C_{IN2}$).

The first capacitor of the plurality of capacitors may be selectively coupled to receive an output voltage signal of the operational amplifier to decrease the gain of the capacitive programmable gain amplifier, at 604. For example, referring to FIG. 3, the first switch ($S_1$) may decouple from the terminal associated with the input voltage signal ($V_{IN}$) and couple to the terminal associated with the output voltage signal ($V_{OUT}$) (e.g., coupling the first capacitor ($C_1$) in parallel with feedback capacitor ($C_{FB}$)) to decrease the gain of the capacitive programmable gain amplifier. As a result, the input capacitance may decrease by the capacitance of the first capacitor ($C_1$), and the feedback capacitance may increase by the capacitance of the first capacitor ($C_1$). Increasing the feedback capacitance and decreasing the input capacitance produces a lower gain.

As another example, referring to FIG. 5, the first switch ($S_{1-1}$) may decouple from the terminal associated with the first input voltage signal ($V_{IN1}$) and couple to the terminal associated with the first output voltage signal ($V_{OUT1}$) (e.g., coupling the first capacitor ($C_{1-1}$) in parallel with first feedback capacitor ($C_{FB1}$) to decrease the gain of the capacitive programmable gain amplifier in FIG. 4. In a similar manner, the first switch ($S_{2-1}$) may decouple from the terminal associated with the second input voltage signal ($V_{IN2}$) and couple to the terminal associated with the second output voltage signal ($V_{OUT2}$) (e.g., coupling the first capacitor ($C_{2-1}$) in parallel with second feedback capacitor ($C_{FB2}$)).

The method 600 of FIG. 6 achieves improved noise performance (e.g., reduced noise) at high gain modes (e.g., relatively large input capacitance) with improved monotonicity. For example, each capacitor in the plurality of capacitors 304, 404, 406 is utilized as either an input capacitor or a feedback capacitor. Because each capacitor in the plurality of capacitors 304, 404, 406 is utilized as either an input capacitor or a feedback capacitor, the capacitive programmable gain amplifier may achieve improved noise performance (e.g., reduced noise) at high gain modes (e.g., relatively large input capacitance) with improved monotonicity.

In conjunction with the described embodiments, an apparatus includes first means for selectively coupling a first capacitor of plurality of capacitors to receive an input voltage signal of a programmable gain amplifier or to receive an output voltage signal of an operational amplifier of the programmable gain amplifier. For example, the first switching means may include the first switch ($S_1$) of FIG. 3, the second switch ($S_2$) of FIG. 3, the third switch ($S_3$) of FIG. 3, the fourth switch ($S_4$) of FIG. 3, the fifth switch ($S_5$) of FIG. 3, the $N^{th}$ switch ($S_N$) of FIG. 3, the first switch ($S_{1-1}$) of FIG. 5, the second switch ($S_{1-2}$) of FIG. 5, the third switch ($S_{1-3}$) of FIG. 5, the fourth switch ($S_{1-4}$) of FIG. 5, the fifth switch ($S_{1-5}$) of FIG. 5, the $K^{th}$ switch ($S_{1-K}$) of FIG. 5, the first switch ($S_{2-1}$) of FIG. 5, the second switch ($S_{2-2}$) of FIG. 5, the third switch ($S_{2-3}$) of FIG. 5, the fourth switch ($S_{2-4}$) of FIG. 5, the fifth switch ($S_{2-5}$) of FIG. 5, the $M^{th}$ switch ($S_{2-K}$) of FIG. 5, one or more other devices, circuits, modules, or any combination thereof.

The apparatus also includes second means for selectively coupling a second capacitor of the plurality of capacitors to receive the input voltage signal or to receive the output voltage signal. For example, the second means may include the first switch ($S_1$) of FIG. 3, the second switch ($S_2$) of FIG. 3, the third switch ($S_3$) of FIG. 3, the fourth switch ($S_4$) of FIG. 3, the fifth switch ($S_5$) of FIG. 3, the $N^{th}$ switch ($S_N$) of FIG. 3, the first switch ($S_{1-1}$) of FIG. 5, the second switch ($S_{1-2}$) of FIG. 5, the third switch ($S_{1-3}$) of FIG. 5, the fourth switch ($S_{1-4}$) of FIG. 5, the fifth switch ($S_{1-5}$) of FIG. 5, the $K^{th}$ switch ($S_{1-K}$) of FIG. 5, the first switch ($S_{2-1}$) of FIG. 5, the second switch ($S_{2-2}$) of FIG. 5, the third switch ($S_{2-3}$) of FIG. 5, the fourth switch ($S_{2-4}$) of FIG. 5, the fifth switch ($S_{2-5}$) of FIG. 5, the $M^{th}$ switch ($S_{2-K}$) of FIG. 5, one or more other devices, circuits, modules, or any combination thereof.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
an operational amplifier;
a plurality of capacitors coupled to an input terminal of the operational amplifier, the plurality of capacitors comprising a first capacitor and a second capacitor;
a first switch coupled to the first capacitor, the first switch configured to selectively couple the first capacitor to receive an input voltage signal of the operational amplifier or to receive an output voltage signal of the operational amplifier; and
a second switch coupled to the second capacitor, the second switch configured to selectively couple the second capacitor to receive the input voltage signal or to receive the output voltage signal, wherein selectively coupling the second capacitor to receive the input voltage signal or to receive the output voltage signal occurs independently of the coupling of the first capacitor to receive the input voltage signal or to receive the output voltage signal.

2. The apparatus of claim 1, further comprising a plurality of switches configured to couple a corresponding capacitor of the plurality of capacitors to a first terminal to receive the input voltage signal or to a second terminal to receive the output voltage signal, the plurality of switches includes the first switch and the second switch.

3. The apparatus of claim 1, wherein the input terminal of the operational amplifier is a virtual ground node.

4. The apparatus of claim 1, further comprising:
an input capacitor coupled to receive the input voltage signal and coupled to the input terminal of the operational amplifier; and
a feedback capacitor coupled to receive the output voltage signal of the operational amplifier and coupled to the input terminal of the operational amplifier.

5. The apparatus of claim 4, wherein the input capacitor, the feedback capacitor, the plurality of capacitors, and the operational amplifier are included in a capacitive programmable gain amplifier.

6. The apparatus of claim 4, further comprising:
a second input capacitor coupled to receive a second input voltage signal and coupled to a second input terminal of the operational amplifier;
a second feedback capacitor coupled to receive a second output voltage signal of the operational amplifier and coupled to the second input terminal of the operational amplifier; and
a second plurality of capacitors coupled to the second input terminal of the operational amplifier and configured to be selectively coupled to receive at least one of the second input voltage signal and the second output voltage signal, or a combination thereof.

7. The apparatus of claim 6, wherein input voltage signal and the second input voltage signal are differential signals, and wherein the output voltage signal and the second output voltage signal are differential signals.

8. The apparatus of claim 6, further comprising a second plurality of switches configured to couple a corresponding capacitor of the second plurality of capacitors to receive the second input voltage signal or to receive the second output voltage signal.

9. The apparatus of claim 8, wherein the second plurality of switches are coupled to a first terminal of the corresponding capacitor and selectively coupled to one of a third terminal to receive the second input voltage signal and a fourth terminal to receive the second output voltage signal, and wherein a second terminal of the corresponding capacitor is coupled to a virtual ground node.

10. A method comprising:
selectively coupling a first capacitor of a plurality of capacitors to receive an input voltage signal of a capacitive programmable gain amplifier including an operational amplifier to increase a gain of the capacitive programmable gain amplifier;
selectively coupling the first capacitor of the plurality of capacitors to receive an output voltage signal of the operational amplifier to decrease the gain of the capacitive programmable gain amplifier;
selectively coupling a second capacitor of the plurality of capacitors to receive the input voltage signal to increase the gain of the capacitive programmable gain amplifier; and
selectively coupling the second capacitor of the plurality of capacitors to receive the output voltage signal to decrease the gain of the capacitive programmable gain amplifier, wherein selectively coupling the second capacitor of the plurality of capacitors to receive the input voltage signal or the output voltage signal occurs independently of the coupling of the first capacitor to receive the input voltage signal or the output voltage signal.

11. The method of claim 10, wherein the first capacitor of the plurality of capacitors is selectively coupled to receive the input voltage signal or to receive the output voltage signal via a switch.

12. The method of claim 11, wherein the switch is coupled to a first terminal of the first capacitor of the plurality of capacitors and selectively coupled to a first terminal to receive the input voltage signal or to a second terminal to receive the output voltage signal, and wherein a second terminal of the first capacitor is coupled to a virtual ground node.

13. An apparatus comprising:
means for selectively coupling a first capacitor of a plurality of capacitors to receive an input voltage signal of an operational amplifier or to receive an output voltage signal of the operational amplifier; and
means for selectively coupling a second capacitor of the plurality of capacitors to receive the input voltage signal or to receive the output voltage signal, wherein selectively coupling the second capacitor to receive the input voltage signal or to receive the output voltage signal occurs independently of the coupling of the first capacitor to receive the input voltage signal or to receive the output voltage signal.

14. The apparatus of claim 13, wherein a terminal of the first capacitor is coupled to a means for providing an input signal and a second terminal of the first capacitor is coupled to a virtual ground node.

15. The apparatus of claim 14, wherein the means for selectively coupling the second capacitor is selectively coupled to a first input terminal or to a second input terminal of the operational amplifier, and wherein the second capacitor is coupled to a virtual ground node.

16. The apparatus of claim 13, wherein the first capacitor is coupled to an amplifier input terminal of the operational amplifier.

17. The apparatus of claim 16, wherein the amplifier input terminal of the operational amplifier is a virtual ground node.

18. The apparatus of claim 13, wherein the second capacitor is coupled to an amplifier input terminal of the operational amplifier.

19. The apparatus of claim 1, wherein the first switch is configured to couple the first capacitor to the input voltage signal and the second switch is configured to couple the second capacitor to the output voltage signal while the first capacitor is coupled to the input voltage signal.

20. The apparatus of claim 1, wherein the second capacitor is configurable to receive the input voltage signal or the output voltage signal via the second switch independently of the first capacitor being configured to receive the input voltage signal or the output voltage signal via the first switch.

21. An apparatus comprising:
an operational amplifier;
a first switch coupled to a first capacitor, the first switch configured to selectively couple a first terminal of the first capacitor to receive an input voltage signal of the operational amplifier or to receive an output voltage signal of the operational amplifier, wherein a second terminal of the first capacitor is non-selectively coupled to an input terminal of the operational amplifier; and
a second switch coupled to a second capacitor, the second switch configured to selectively couple a first terminal of the second capacitor to receive the input voltage signal or to receive the output voltage signal, wherein a second terminal of the second capacitor is non-selectively coupled to the input terminal of the operation amplifier.

* * * * *